(12) United States Patent
Reiber

(10) Patent No.: US 7,124,927 B2
(45) Date of Patent: *Oct. 24, 2006

(54) FLIP CHIP BONDING TOOL AND BALL PLACEMENT CAPILLARY

(76) Inventor: Steven F. Reiber, 4409 Vivien Way, Rocklin, CA (US) 95677

(*) Notice: Subject to any disclaimer, the term of this patent is extended or adjusted under 35 U.S.C. 154(b) by 0 days.

This patent is subject to a terminal disclaimer.

(21) Appl. No.: 11/107,308

(22) Filed: Apr. 15, 2005

(65) Prior Publication Data

US 2005/0242155 A1     Nov. 3, 2005

Related U.S. Application Data

(63) Continuation-in-part of application No. 10/942,311, filed on Sep. 15, 2004, and a continuation-in-part of application No. 10/943,151, filed on Sep. 15, 2004, which is a continuation-in-part of application No. 10/650,169, filed on Aug. 27, 2003, now Pat. No. 6,935,548, which is a continuation of application No. 10/036,579, filed on Dec. 31, 2001, now Pat. No. 6,651,864, and a continuation-in-part of application No. 09/514,454, filed on Feb. 25, 2000, now Pat. No. 6,354,479.

(60) Provisional application No. 60/503,267, filed on Sep. 15, 2003, provisional application No. 60/288,203, filed on May 1, 2001, provisional application No. 60/121,694, filed on Feb. 25, 1999.

(51) Int. Cl.
*B23K 37/00* (2006.01)

(52) U.S. Cl. ............... 228/4.5; 228/6.1; 228/180.5
(58) Field of Classification Search ............... None
See application file for complete search history.

(56) References Cited

U.S. PATENT DOCUMENTS

| | | |
|---|---|---|
| 2,892,924 A | 6/1959 | Wood |
| 3,538,205 A | 11/1970 | Gates, Jr. et al. |
| 3,563,443 A | 2/1971 | Perdotti et al. |
| 3,660,050 A | 5/1972 | Iler et al. |
| 3,917,148 A | 11/1975 | Runyon |
| 3,938,722 A | 2/1976 | Kelly et al. |
| 3,971,499 A | 7/1976 | Goodrich, Jr. et al. |

(Continued)

FOREIGN PATENT DOCUMENTS

EP     0435423     7/1991

(Continued)

OTHER PUBLICATIONS

Stan Weitz, "Trends in ESD Test Methods," Materials Testing Section of the ETS Testing Laboratory, Electrotech Systems, 1998, pp. 1-7.

(Continued)

*Primary Examiner*—Lynne R. Edmondson
(74) *Attorney, Agent, or Firm*—Carr & Ferrell LLP

(57) ABSTRACT

A flip chip bonding tool and ball placement capillary system comprising a dissipative material with a resistance low enough to prevent a discharge of a charge to a device being bonded and high enough to avoid current flow to the device being bonded is disclosed.

17 Claims, 6 Drawing Sheets

U.S. PATENT DOCUMENTS

| | | | |
|---|---|---|---|
| 3,986,255 A | 10/1976 | Mandal |
| 3,986,653 A | 10/1976 | Gilding |
| 4,020,543 A | 5/1977 | Pennings |
| 4,050,762 A | 9/1977 | Hines et al. |
| 4,157,932 A | 6/1979 | Hirata |
| 4,171,477 A | 10/1979 | Funari |
| 4,182,947 A | 1/1980 | Brower |
| 4,315,128 A | 2/1982 | Matcovich et al. |
| 4,331,048 A | 5/1982 | Dworak et al. |
| 4,387,283 A | 6/1983 | Peterson et al. |
| 4,390,771 A | 6/1983 | Kurtz et al. |
| 4,405,074 A | 9/1983 | Levintov et al. |
| 4,502,983 A | 3/1985 | Omori et al. |
| 4,513,190 A | 4/1985 | Ellett et al. |
| 4,554,033 A | 11/1985 | Dery et al. |
| 4,555,052 A | 11/1985 | Kurtz et al. |
| 4,686,465 A | 8/1987 | Kruger |
| 4,691,854 A | 9/1987 | Haefling et al. |
| 4,705,204 A | 11/1987 | Hirota et al. |
| 4,772,498 A | 9/1988 | Bertin et al. |
| 4,821,944 A | 4/1989 | Tsumura |
| 4,842,662 A | 6/1989 | Jacobi |
| 4,897,710 A | 1/1990 | Suzuki et al. |
| 4,899,921 A | 2/1990 | Bendat et al. |
| 4,909,427 A | 3/1990 | Plaisted et al. |
| 4,974,767 A | 12/1990 | Alfaro et al. |
| 4,998,002 A | 3/1991 | Okikawa et al. |
| 5,123,935 A | 6/1992 | Kanamaru et al. |
| 5,144,747 A | 9/1992 | Eichelberger |
| 5,178,742 A | 1/1993 | Lemke et al. |
| 5,180,093 A | 1/1993 | Stansbury et al. |
| 5,214,259 A | 5/1993 | Terakado et al. |
| 5,217,154 A | 6/1993 | Elwood et al. |
| 5,250,843 A | 10/1993 | Eichelberger |
| 5,280,979 A | 1/1994 | Poli et al. |
| 5,290,507 A | 3/1994 | Runkle |
| 5,341,979 A | 8/1994 | Gupta |
| 5,347,086 A | 9/1994 | Potter et al. |
| 5,367,956 A | 11/1994 | Fogle, Jr. |
| 5,421,503 A | 6/1995 | Perlberg et al. |
| 5,427,301 A | 6/1995 | Pham et al. |
| 5,437,405 A | 8/1995 | Asanasavest |
| 5,463,197 A | 10/1995 | Miyazaki |
| 5,491,605 A | 2/1996 | Hughbanks et al. |
| 5,527,441 A | 6/1996 | Offer |
| 5,544,804 A | 8/1996 | Test et al. |
| 5,558,270 A | 9/1996 | Nachon et al. |
| 5,601,740 A | 2/1997 | Eldridge et al. |
| 5,616,257 A | 4/1997 | Harada et al. |
| 5,649,355 A | 7/1997 | Offer |
| 5,651,901 A | 7/1997 | Mohri et al. |
| 5,662,261 A | 9/1997 | Fogal |
| 5,669,545 A | 9/1997 | Pham et al. |
| 5,676,856 A | 10/1997 | Haji et al. |
| 5,797,388 A | 8/1998 | Nakamura et al. |
| 5,816,472 A | 10/1998 | Linn |
| 5,827,470 A | 10/1998 | Chatterjee et al. |
| 5,871,141 A | 2/1999 | Hadar et al. |
| 5,931,368 A | 8/1999 | Hadar et al. |
| 5,984,162 A | 11/1999 | Hortaleza et al. |
| 6,030,472 A | 2/2000 | Hajaligol et al. |
| 6,041,995 A | 3/2000 | Takahashi et al. |
| 6,053,777 A | 4/2000 | Boyle |
| 6,073,827 A | 6/2000 | Razon et al. |
| 6,219,911 B1 | 4/2001 | Estes et al. |
| 6,325,269 B1 | 12/2001 | Suzuki et al. |
| 6,337,522 B1 | 1/2002 | Kang et al. |
| 6,354,479 B1 * | 3/2002 | Reiber et al. ............... 228/4.5 |
| 6,646,355 B1 | 11/2003 | Kang et al. |
| 6,651,864 B1 * | 11/2003 | Reiber et al. ............... 228/4.5 |
| 6,759,642 B1 | 7/2004 | Hoshino |
| 6,905,350 B1 | 6/2005 | Wallash et al. |
| 6,935,548 B1 | 8/2005 | Reiber |
| 2005/0109814 A1 | 5/2005 | Reiber |
| 2005/0109817 A1 | 5/2005 | Reiber |

FOREIGN PATENT DOCUMENTS

| | | |
|---|---|---|
| GB | 2287897 | 10/1995 |
| JP | 54037114 | 3/1979 |
| JP | 63164228 | 7/1988 |
| JP | 63-239959 | 10/1988 |
| JP | 02-67741 | 3/1990 |
| JP | 04-149065 | 5/1992 |
| JP | 04-149605 | 5/1992 |
| JP | 06-45389 | 2/1994 |
| JP | 09-162223 | 6/1997 |
| JP | 11-186315 | 7/1999 |
| JP | 11-251357 | 9/1999 |
| JP | 2001-201515 | 7/2001 |
| JP | 2001-351934 | 12/2001 |

OTHER PUBLICATIONS

Instrument FAQs, Drivers, Libraries and Examples, Keithley Instrument Model 6517/6517A, Keithley Instruments, Inc., 1999, pp. 1-2.

Keithley Instruments Model 6517A Electrometer/High Resistance Meter, Keithley Instruments, Inc., pp. 1-9, date unknown.

"Low-Current/High-Resistance Meters," Keithley Instruments Model 6517A, Keithley Instruments, Inc. pp. 112-115, date unknown.

Keytech 200 XV-2 ESD Simulator, Kandus Equipment, p. 1, date unknown.

Newburg, Carl E., "Test Report", Anza Technology, Incorporated Static Dissipative Ceramic Rods . . . , Report 190:2000-92, River's Edge Technical Service, Nov. 29, 2000, pp. 1-5.

Huntsman, James et al., "Test Methods for Static Control Products," Electrical Overstress/Electrostatic Discharge Sym., Sep. 21, 1982, pp. 94-109, v1.4, IIT Rsrch Inst.

Mayer, Michael et al., "Active Test Chips for In Situ Wire Bonding Process Characterization," Semicon Singapore 2001, May 2001.

National Semiconductor, "Semiconductor Packaging Assembly Technology," Aug. 1999.

Suman et al., "Wire Bond Temperature Sensor," IMAPS International Symposium on Microelectronics, Baltimore, MD, Oct. 9-11, 2001.

Klossner, et al., "An Integrated Approach to Solving sub-45um Wire Bond Process Challenges," SEMICON Singapore, 2001.

Wilson, et al. "Holographic Interferometry Applied to Motion Studies of Ultrasonic Bonders," IEEE Transactions on Sonics and Ultrasonics, vol. 19, No. 4, Oct. 1972.

Olney et al., "A New ESD Model: The Charged Strip Model," EOS/ESD Symposium Proceedings, 2002.

Andres et al., "Bumping Wafers via Ultrasonically Enhanced Stencil Printing," SEMICON West 2003.

Jittinorasett, Suwanna, "UBM Formation on Single Die/Dice for Flip Chip Applications," Aug. 1999.

Zakel, et al., "Laser Solder Attach for Optoelectronic Packages," Proceedings of the PhoPack Conference (Stanford University, California), Jul. 2002.

PacTech Packaging Technologies, "Laser Solder Ball Jet System," www.pactech-usa.com, date unknown.

* cited by examiner

FLIP CHIP BONDING TOOL AND BALL PLACEMENT CAPILLARY

CROSS REFERENCE TO RELATED APPLICATIONS

This application is a continuation-in-part and claims the priority benefit of U.S. patent application Ser. No. 10/942,311 filed Sep. 15, 2004 entitled "Flip Chip Bonding Tool Tip"; this application is also a continuation-in-part and claims the priority benefit of U.S. patent application Ser. No. 10/943,151 filed Sep. 15, 2004 and entitled "Bonding Tool with Resistance"; U.S. patent application Ser. No. 10/942,311 and U.S. patent application Ser. No. 10/943,151 are a continuation-in-part and claim the priority benefit of U.S. patent application Ser. No. 10/650,169 filed Aug. 27, 2003 entitled "Dissipative Ceramic Bonding Tool Tip" now U.S. Pat. No. 6,935,548 which is a continuation of U.S. patent application Ser. No. 10/036,579 filed Dec. 31, 2001, now U.S. Pat. No. 6,651,864, entitled "Dissipative Ceramic Bonding Tool Tip" which claims the priority benefit of U.S. provisional patent application No. 60/288,203 filed May 1, 2001 and is also a continuation-in-part of U.S. patent application Ser. No. 09/514,454 filed Feb. 25, 2000, now U.S. Pat. No. 6,354,479 and entitled "Dissipative Ceramic Bonding Tool Tip" which claims the priority benefit of provisional patent application No. 60/121,694 filed Feb. 25, 1999; U.S. patent application Ser. No. 10/942,311 and U.S. patent application Ser. No. 10/943,151 also claim the priority benefit of U.S. provisional patent application No. 60/503,267 filed Sep. 15, 2003 and entitled "Bonding Tool." The contents of all of these applications are incorporated herein by reference.

BACKGROUND OF THE INVENTION

1. Field of the Invention

The present invention relates to flip chip bonding tool tips. More particularly, the present invention relates to dissipative and insulative ceramic flip chip bonding tools and capillaries for ball placement for bonding electrical connections.

2. Description of the Prior Art

Integrated circuits have different methods of attachment to a lead frame. One method is an ultrasonic wire bond whereby individual leads are connected to individual bond pads on the integrated circuit with wire. Ball bonding—a type of wire bonding—involves a process whereby a metal sphere is melted on a length of wire. Wedge bonding is similar to ball bonding except that the process generally utilizes aluminum wire; no 'ball' is formed and the process can be performed at room temperature. Gold ball bonding, on the other hand, typically occurs at temperatures in excess of 150° Celsius. Gold ball bonding is most often used in high volume applications as it is a faster process whereas aluminum wire bonding is used in situations when packages or a printed circuit board cannot be heated. Gold ball bonding, too, has pitch limits of approximately 60 micron. Aluminum wedge bonding can be performed as pitches finer than 60 micron.

Wire bonding techniques use "face-up" chips with a wire connection to each pad. Bump or "flip chip" microelectronic assembly, on the other hand, is a direct electrical connection of face-down—"flipped"—electronic components onto substrates, circuit boards, or carriers by means of conductive bumps on a chip bond pad.

Flip chip components are predominantly semiconductor devices. Components such as passive filters, detector arrays, and MEMs devices are also used in flip chip form. Flip chip is sometimes referred to as Direct Chip Attach (DCA) as the chip is attached directly to the substrate, board, or carrier by the conductive bumps. Automotive electronics, electronic watches, and a growing percentage of cellular phones, pagers, and high speed microprocessors are assembled with flip chips.

The bump serves several functions in the flip chip assembly. Electrically, the bump provides the conductive path from chip to substrate. The bump also provides a thermally conductive path to carry heat from the chip to the substrate. In addition, the bump provides part of the mechanical mounting of a die to the substrate. The bump also provides a spacer, preventing electrical contact between the chip and substrate conductors, and acting as a short lead to relieve mechanical strain between board and substrate.

Stud bumps are placed on die bond pads through a modification of the "ball bonding" process used in conventional wire bonding or by the use of a ball placement machine where small balls are forced down a small capillary onto a pad and then laser reflowed. In the ball bonding referenced above, a tip of a bond wire is melted to form a sphere. A wire bonding tool presses this sphere against an aluminum bond pad, applying mechanical force, heat, and ultrasonic energy to create a metallic connection.

For stud bumping, the first ball bond is made as described but the wire is then broken close above the ball. The resulting ball, or "stud bump" remaining on the bond pad provides a permanent and reliable connection through the aluminum oxide to the underlying metal. After placing the stud bumps on a chip, the stud bumps may be flattened—"coined"—by mechanical pressure to provide a flatter top surface and more uniform bump heights while pressing any remaining wire tail into the ball. Each bump may be coined by a tool immediately after forming or all bumps on the die may be simultaneously coined by pressure against a flat surface in a separate operation following bumping.

Bonding tool tips must be sufficiently hard to prevent deformation under pressure, and mechanically durable so that many bonds can be made before replacement. Typical flip chip bonding tips available on the market today are made of a tungsten carbide or titanium carbide. These conducting tools are very hard compounds that have been successfully used on commercial machines as these compounds provide a reasonably long life in use as a flip chip bonding tool and ball placement capillary.

The problem, however, is that an electrostatic discharge (ESD) from the bonding tool or transient currents from the machine can damage the very circuit the tool is bonding. Flip chip bonding and ball placement capillaries tools must be electrically designed to produce a reliable electrical contact, yet prevent electrostatic discharge damage to the part being bonded. Certain prior art devices have a one-or-more volt emission when the tip makes bonding contact. This could present a problem as a one-volt static discharge can generate a 20 milliamp current to flow, which, in certain instances, can cause the integrated circuit to fail due to this unwanted current.

SUMMARY OF THE INVENTION

Dissipative flip chip bonding tools and ball placement capillaries for bonding electrical connections to bonding pads on electrical devices are disclosed. In accordance with the principles of the present invention, to avoid damaging delicate electronic devices by any electrostatic discharge, a flip chip bonding tool tip conducts electricity at a rate sufficient to prevent charge buildup but not at so high a rate as to overload the device being bonded. In other words, it is desirable for the bonding tip to discharge slowly to avoid a sudden surge of current that can damage the part being bonded.

In one embodiment, a resistance in the tip assembly itself may range from $10^2$ to $10^{19}$ ohms. The tools in such an embodiment also have specific mechanical properties to function satisfactorily. High stiffness and high abrasion resistance requirements may result in the utilization of ceramics (e.g., electrical non-conductors) or metals like tungsten carbide (e.g., electrical conductors).

In an embodiment of the present invention, flip chip bonding tool and ball placement capillaries with the desired electrical conduction can be made with three different configurations. Tools can be made from a uniform extrinsic semi-conducting material on an insulator. Tools can also be made by forming a thin layer of a highly doped semi-conductor on an insulator on a core. Finally, tools can be made by forming a lightly doped semi-conductor layer on a conducting core.

DETAILED DESCRIPTION OF AN EMBODIMENT

Figure 1:
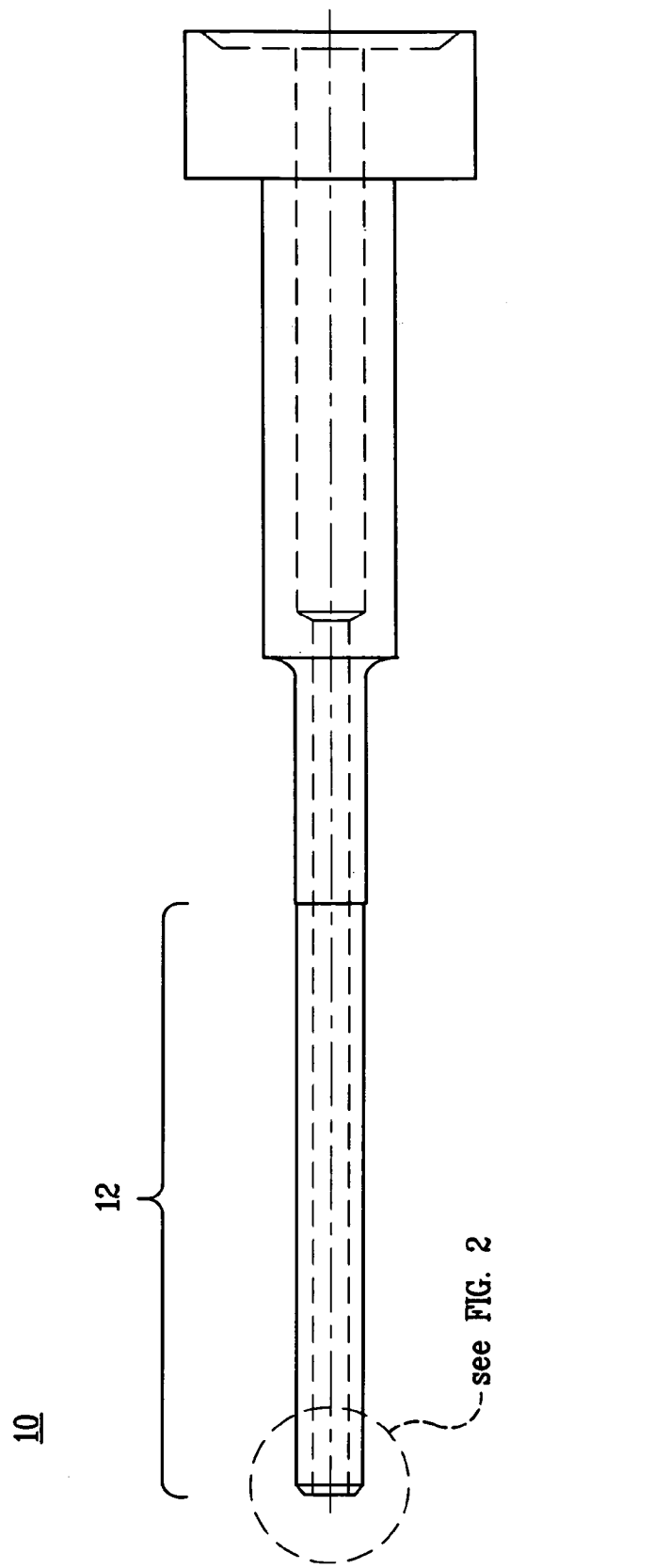
FIG. 1 is a cross-sectional view of a flip chip bonding tool tip.

FIG. 1 illustrates an embodiment of a flip chip bonding tool 10. In one embodiment, the bonding tool is about two inches (30 to 80 mm) long and about 0.124 inch (3.0 mm) in diameter. An exemplary bonding tool tip 12, itself, is from 3 to 100 mils (0.8 to 2.54 mm) long. Running a length of the tool, but not viewable in FIG. 1, is a tube hole, which will accommodate a vacuum to, for example, pick up a tool.

Figure 2:
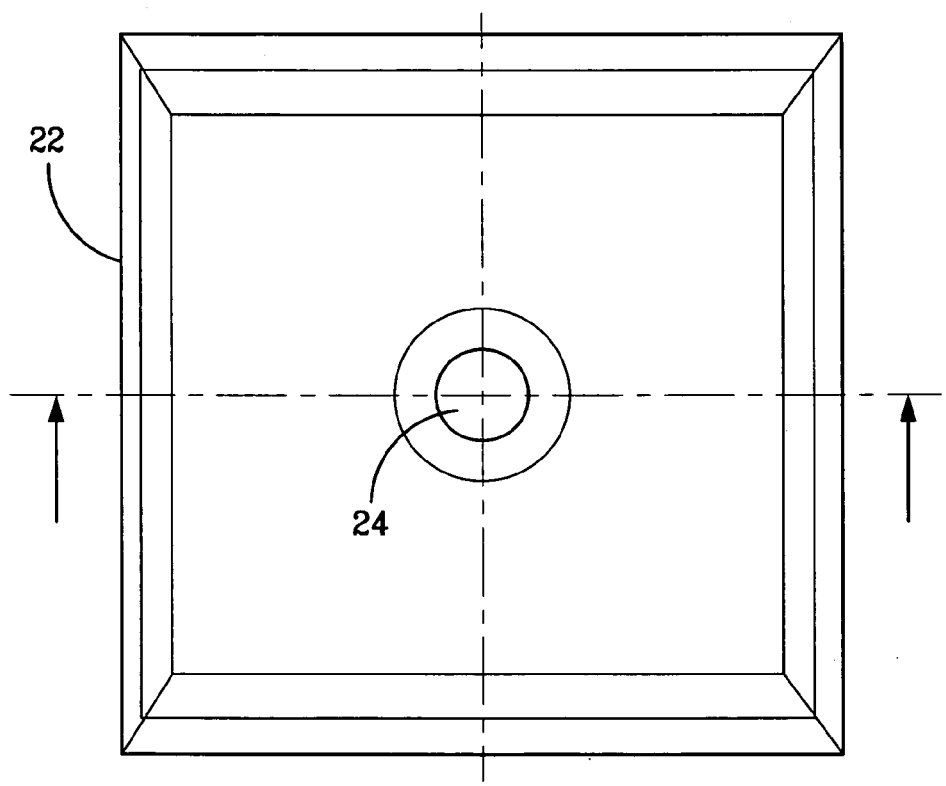
FIG. 2 is an enlarged, cross-sectional view of the flip chip bonding tool of FIG. 1.

FIG. 2 is an enlarged, cross-sectional view of the flip chip bonding tool 10 of FIG. 1. Only that portion of the bonding tool 10 shown within the dotted circle in FIG. 1 is shown in FIG. 2. As shown, tool tip 22 has a tube hole 24, which may run an entire length of the bonding tool 10.

In accordance with principles of the present invention, to avoid damaging delicate electronic devices by an electrostatic discharge, a bonding tool tip conducts electricity at a rate sufficient to prevent charge buildup but not at so high a rate as to overload a device being bonded. It has been determined that the tool should have electrical conduction greater than one ten-billionth of a mho (i.e., $>1\times10^{-19}$ reciprocal ohms), but the tool's electrical conductivity should be less than one one-hundred thousandth of a mho (i.e., $<1\times10^{-2}$ reciprocal ohms). Further, the tool's resistance should be low enough that the material is not an insulator and does not allow for any dissipation of charge, but high enough that the material is not a conductor and allows a current flow. In one embodiment of the present invention, a resistance in the tip assembly ranges from $10^2$ to $10^{19}$ ohms. Five (5) milliamps of current will, generally, damage present-day magnetic recording heads. Preferably, for today's magnetic recording heads, no more than 2 to 3 milliamps of current should be allowed to pass through the tip to a head.

The tools should also have specific mechanical properties to function satisfactorily. Due to high stiffness and high abrasion resistance requirements, ceramics (e.g., electrical non-conductors) or metals, such as tungsten carbide (e.g., electrical conductor) have emerged as preferred materials. In one embodiment, the tip comprises a Rockwell hardness of about 55 or above. More preferably, in an embodiment, the Rockwell hardness is about 85 or above. In an embodiment of the present invention, the tip lasts for approximately fifteen thousand bondings.

In the present invention, flip chip bonding tool and ball placement capillaries with the desired electrical conduction can be made with three different configurations.

First, the tools may be made from a uniform extrinsic semi-conducting material or insulator, which has dopant atoms in appropriate concentrations and valence states to produce sufficient mobile charge carrier densities—unbound electrons or holes. Sufficient mobile charge carrier densities result in electrical conduction in a desired range. Silicon carbide uniformly doped with boron is an example of such a uniform extrinsic semi-conducting material. Silicon nitride is a further example of a uniform non-conducting material. Polycrystalline silicon carbide uniformly doped with boron is yet another example of such a uniform extrinsic semi-conducting material.

Second, the tools may be made by forming a thin layer of a highly doped semi-conductor on an insulating core. In this instance, the core provides mechanical stiffness, and the semi-conductor surface layer provides abrasion resistance and a charge carrier path from tip to a mount. This resistance and carrier path will permit dissipation of electrostatic charge at an acceptable rate. A diamond tip wedge that is ion implanted with boron is an example of such a thin layered tool.

Third, the tools may be made by forming a lightly doped semi-conductor layer on a conducting core. The conducting core provides mechanical stiffness and the semi-conductor layer provides abrasion resistance and a charge carrier path from tip to conducting core, which is electrically connected to the mount. The doping level is chosen to produce conductivity through the layer which will permit dissipation of electrostatic charge or stop all transient current at an acceptable rate. A cobalt-bonded tungsten carbide coated with titanium nitride carbide is an example of such a lightly doped tool.

Figure 3:
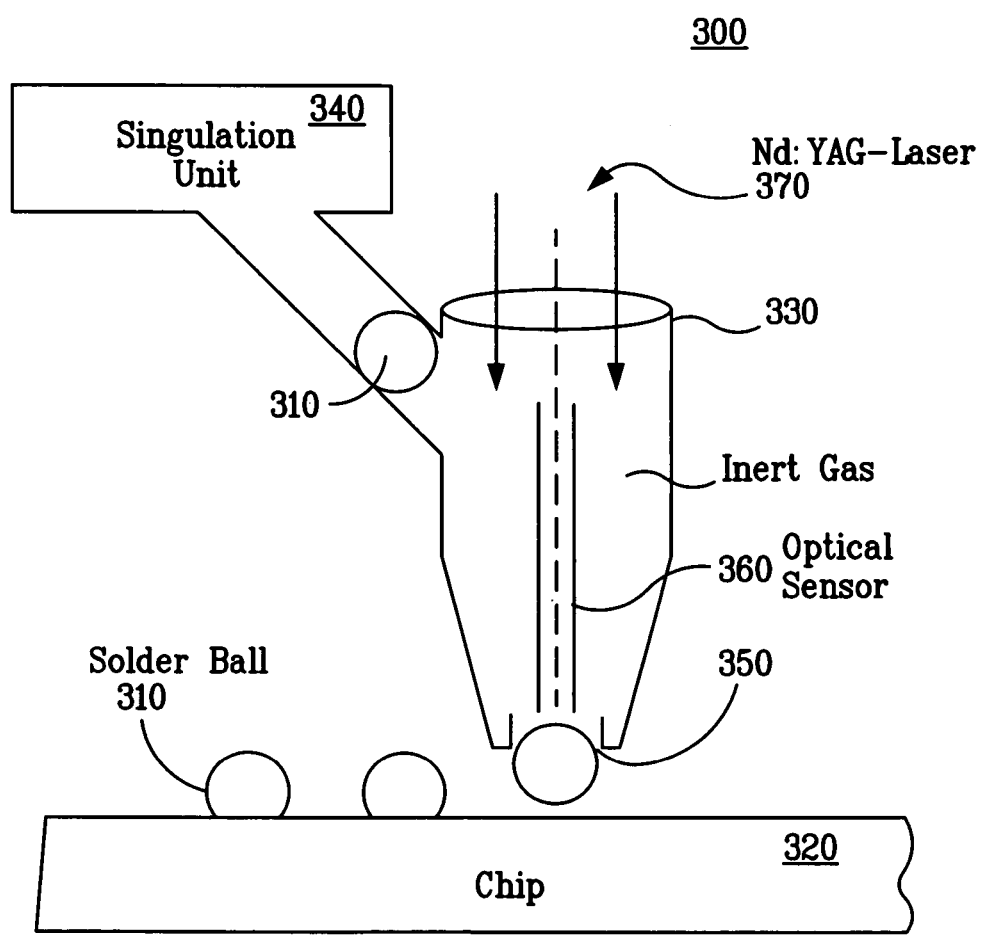
FIG. 3 is an exemplary ball placement capillary.

FIG. 3 is an exemplary ball placement capillary system 300. The ball placement capillary system 300 sequentially solders a ball to a variety of different microelectronic substrates. An embodiment of the invention may singulate, position, and reflow solder balls 310 on a chip 320 with a diameter between 100 µm and 760 µm.

Capillary system 300 comprises a bondhead 330 coupled to a singulation unit 340, a capillary 350 for ball positioning, an optional optical sensor 360, and a laser system 370. Some embodiments of the capillary system 300 may further comprise a pressure sensor (not shown) and various vacuum capabilities (not shown), for example, a vacuum ejector. Bondhead 330 is further coupled to a solder ball loading station (not shown). The bondhead 330 is the mechanical apparatus generally responsible for physical delivery of solder balls to various locales on a chip or substrate.

Bondheads 330 are usually configured to deliver a particular size of solder ball typically ranging in size from 100 µm to 760 µm. The bondhead 330 is generally configured, in exemplary embodiments, to travel on an X-, Y-, and Z-axis. The exemplary bondhead 330 is typically controlled by a general computing device coupled to a keyboard or joystick to allow for directional control by a user or operator of the capillary system 300.

Singulation unit 340 operates to queue and subsequently deliver individual solder balls 310 to the capillary 350 for physical delivery and placement on the chip 320. Singulation unit 340 may operate in conjunction solder ball loading station (not shown). Capillary 350 serves to provide a physical channel for ejection of a solder ball onto chip 320 or other substrate surface. Optical sensor 360 operates to optimize placement of the solder ball 310 on the chip 320.

Laser system 370 utilizes a pointing laser as a target light for precise location of the reflowed solder ball 310 on the chip 320 and may operate in conjunction with optical sensor 360 to further optimize precise solder ball 310 placement. One embodiment of laser system 370 comprises a solid state, pulsed neodymium:yttrium-aluminum-garnet (Nd:YAG) laser. In a Nd:YAG laser, a cylindrical rod of yttrium-aluminum-garnet doped with neodymium is the active medium. Such a laser may comprise a wavelength of approximately 1064 nm, laser energy of 4J and a pulse frequency and width of up to 10 Hz and 1 ms to 20 ms, respectively. The laser system 370 also is operative to melt the solder ball 310 thereby wetting the chip 320 to provide a sufficient interface.

Figure 4:
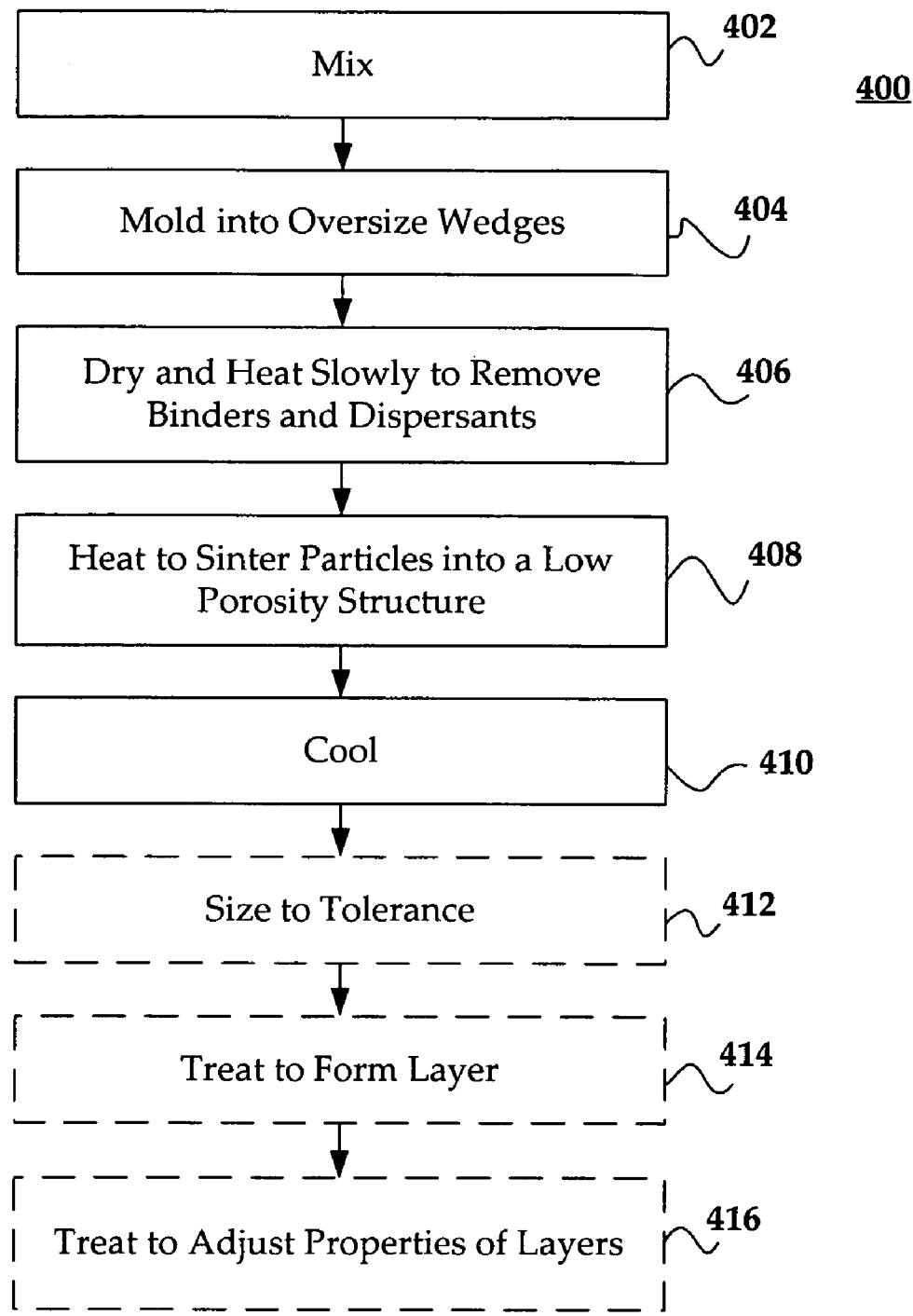
FIG. 4 is an exemplary method for manufacturing a dissipative flip chip bonding tool through the use of mixing, molding, and sintering reactive powders.
Figure 5:
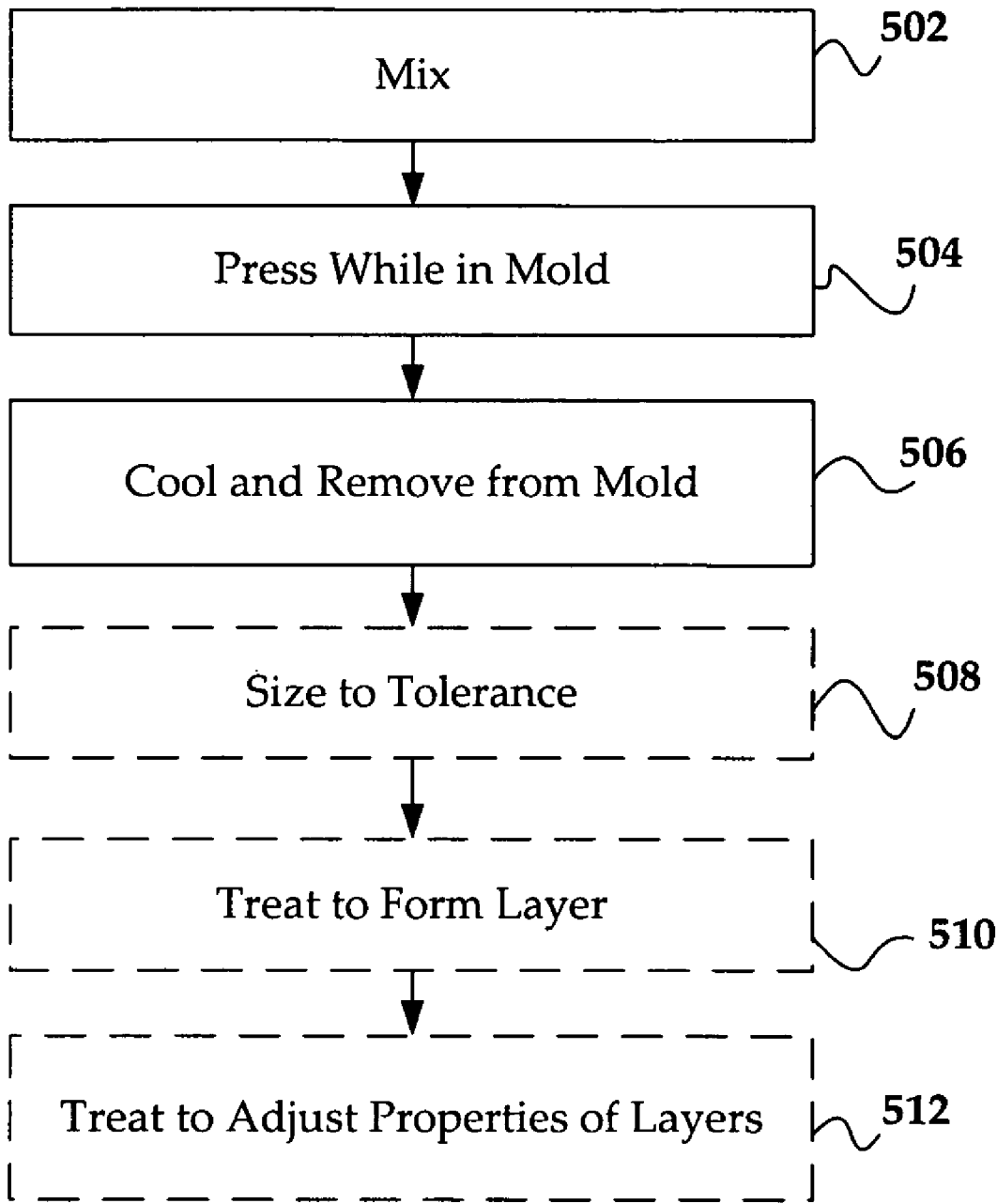
FIG. 5 is an exemplary method for manufacturing a dissipative flip chip bonding tool tip through the use of hot pressing reactive powders.
Figure 6:
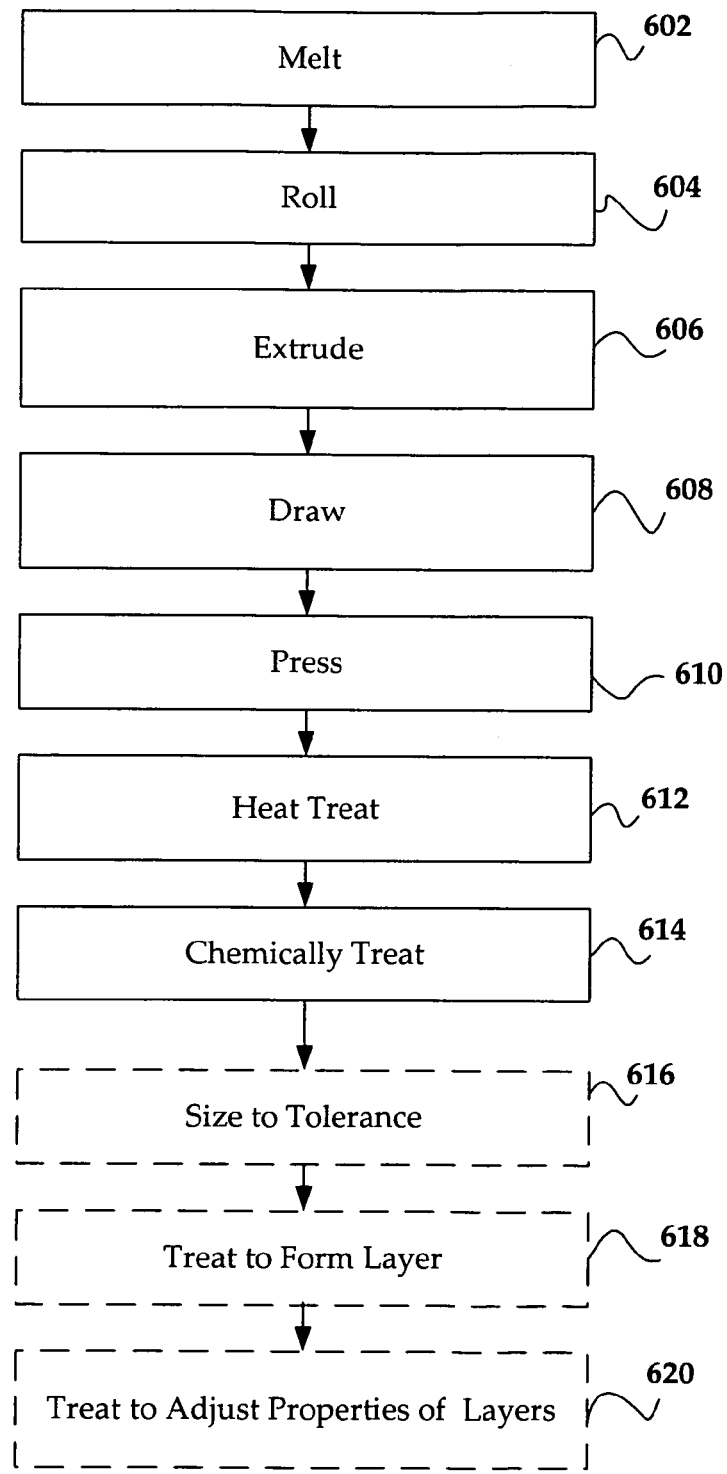
FIG. 6 is an exemplary method for manufacturing a dissipative flip chip bonding tool tip through fusion casting.

Dissipative tools can be manufactured through the use of mixing, molding, and sintering reactive powders as shown in the flowchart of FIG. 4; the use of hot pressing reactive powders as shown in the flowchart of FIG. 5; and through fusion casting as shown in the flowchart of FIG. 6.

Through the use of mixing, molding, and sintering reactive powders (flowchart 400 of FIG. 4), fine particles of a desired composition are mixed 402 with organic and inorganic solvents, dispersants, binders, and sintering aids and then molded 404 into oversized wedges. The wedges are carefully dried and slowly heated to a temperature between 500–2500 degrees Celsius 406 to remove the binders and dispersants. The wedges are then heated to a high enough temperature so that individual particles sinter together 408 into a solid structure with low porosity. The heat-treating atmosphere is chosen to facilitate the removal of the binder at a low temperature and to control valence of dopant atoms at a higher temperature and while cooling. After cooling 410, the wedges may be optionally machined, or otherwise sized, 412 to achieve required tolerances.

The wedges may then be optionally treated 414 to produce a desired surface layer by ion implementation, vapor deposition, chemical vapor deposition, physical deposition, electroplating deposition, neutron bombardment, or combinations of the above. The pieces may optionally be subsequently heat treated 416 in a controlled atmosphere (e.g., 2000 to 2500 degrees Celsius for 3 to 5 minutes) to produce the desired layer properties through diffusion, re-crystallization, dopant activation, or valence changes of metallic ions.

Through the use of hot pressing reactive powders (flowchart 500 of FIG. 5), fine particles of a desired composition are mixed 502 with binders and sintering aids and then pressed 504 in a mold at a high enough temperature (e.g., 1000 to 4000 degrees Celsius) to cause consolidation and binding of the individual particles into a solid structure with low porosity. The hot pressing atmosphere is chosen to control valence of dopant atoms. After cooling and removal 506 from the hot press mold, the pieces may optionally be machined, or otherwise sized, 508 to achieve required tolerances. The pieces may then be optionally treated 510 to produce a desired surface layer by ion implantation, vapor deposition, chemical vapor deposition, physical deposition, electo-plating deposition, neutron bombardment, or combinations of the above. The pieces may optionally be subsequently heat treated 512 in a controlled atmosphere to produce desired layer properties through diffusion, re-crystallization, dopant activation, or valence changes of metallic ions.

Through fusion casting (flowchart 600 of FIG. 6), metals of a desired composition are melted 602 in a non-reactive crucible then cast into an ingot. The ingot is then rolled 604, extruded 606, drawn 608, pressed 610, heat-treated 612 in a suitable atmosphere, and chemically treated 614. The pieces may then optionally be machined, or otherwise sized, 616 to achieve required tolerances. The metallic pieces may also be optionally heat-treated to produce a desired surface layer 618 by vapor deposition, chemical vapor deposition, physical deposition, electroplating deposition, or combinations of the above. The pieces may optionally be subsequently heat-treated in a controlled atmosphere to produce desired layer properties 620 through diffusion, re-crystallization, dopant activation, or valence changes of metallic ions.

In an embodiment of the invention, the layer used in the bonding process could be a formula for dissipated or insulative ceramic comprising alumina (aluminum oxide $Al_2O_3$) and zirconia (zirconium oxide $ZrO_2$) and other elements or a silicon carbide with boron. This mixture is both somewhat electrically conductive and mechanically durable. The tip of a bonding tool can be coated with this material or the tip can be made completely out of this material. The shape of the tip may be wedge- or circular-shaped.

The bonding tip of the present invention may be used for any number of different types of bonding including ultrasonic and thermal flip chip bonding.

While the present invention has been described with reference to an exemplary embodiment, it will be understood by those skilled in the art that various changes may be made and equivalents may be substituted for elements thereof without departing from the true spirit and scope of the present invention. In addition, modifications may be made without departing from the essential teachings of the present invention.

What is claimed is:

1. A flip chip bonding tool and ball placement capillary system for connecting leads on integrated circuit bonding pads, comprising a dissipative material having a resistance low enough to prevent a discharge of a charge to a device being bonded and high enough to stop current flow large enough to damage the device being bonded.

2. The system of claim 1, wherein the dissipative material comprises a resistance in the range of $10^2$ to $10^{19}$ ohms.

3. The system of claim 1, wherein the bonding tool comprises a vacuum tube.

4. The system of claim 1, wherein the dissipative material comprises a semi-conducting material.

5. The system of claim 4, wherein the semi-conducting material comprises dopant atoms in appropriate concentration and valence states to produce resistance.

6. The system of claim 4, wherein the semi-conductive material comprises silicon carbide.

7. The system of claim 6, wherein the silicon carbide is uniformly doped with boron.

8. The system of claim 1, wherein the dissipative material comprises a doped semi-conductor formed on an insulating core.

9. The system of claim 8, wherein the insulating core comprises a diamond.

10. The system of claim 8, wherein the doped semi-conductor further comprises an outer surface of the insulating core implanted with boron.

11. The system of claim 1, wherein the dissipative material comprises a doped semi-conductor formed on a conducting core.

12. The system of claim 11, wherein the conducting core comprises a cobalt-bonded tungsten carbide.

13. The system of claim 11, wherein the conducting core is coated with titanium nitride carbide.

14. An ESD-preventive device comprising:
a flip chip bonding tool and ball placement capillary, comprising a dissipative material and configured to come in contact with a device being bonded, wherein a current produced by static charge generated during bonding is allowed to flow; wherein the dissipative material has a resistance low enough to prevent a discharge of charge to the device being bonded and high enough to stop all current flow to the device being bonded.

15. The ESD-preventive device of claim 14, wherein the current flow allowed is no more than 3 milliamps.

16. A method of utilizing a flip chip bonding tool and ball placement capillary in a microelectronic assembly, comprising:

providing a bonding machine capable of being equipped with a flip chip bonding tool and ball placement capillary having a tip comprised of a dissipative material, the dissipative material having a resistance low enough to prevent a discharge of a charge to a device being bonded and high enough to stop all current flow to the device being bonded;

equipping the bonding machine with the flip chip bonding tool and ball placement capillary;

providing a bonding material that is thermally and electrically conductive;

melting the bonding material so that the bonding material becomes substantially spherical in shape; and electrically connecting at least one component to a substrate by means of pressing the substantially spherical-shaped bonding material, the substantially spherical bonding material being pressed to form a conductive bump.

17. The method of claim 16, further comprising coining the conductive bump.

* * * * *

Disclaimer 7,124,927—Steven F. Reiber, Rocklin, CA (US). FLIP CHIP BONDING TOOL AND BALL PLACEMENT CAPILLARY. Patent dated December 7, 2009 by Inventor and Owner, Steven F. Reiber.

Hereby enters this disclaimer to claims 5-13 of said patent.

*(Official Gazette, April 13, 2010)*